United States Patent
Hwang et al.

[19]

[11] Patent Number: 6,117,718

[45] Date of Patent: Sep. 12, 2000

[54] METHOD FOR FORMING BJT VIA FORMULATION OF HIGH VOLTAGE DEVICE IN ULSI

[75] Inventors: Ching-Chun Hwang, Taichung; Sheng-Hsiung Yang, Hsin-Chu, both of Taiwan

[73] Assignee: United Microelectronics Corp., Hsin-Chu, Taiwan

[21] Appl. No.: 09/386,674

[22] Filed: Aug. 31, 1999

[51] Int. Cl.$^7$ .................................................. H01L 21/8238
[52] U.S. Cl. .......................... 438/204; 438/202; 438/203; 438/205; 257/370
[58] Field of Search ...................... 438/202, 203, 438/204, 205; 257/370

[56] References Cited

U.S. PATENT DOCUMENTS

| | | |
|---|---|---|
| 4,325,180 | 4/1982 | Curran . |
| 4,891,328 | 1/1990 | Gris . |
| 4,956,305 | 9/1990 | Arndt . |
| 5,149,663 | 9/1992 | Chai et al. . |
| 5,439,833 | 8/1995 | Hebert et al. . |
| 5,506,156 | 4/1996 | Watanabe et al. . |
| 5,780,329 | 7/1998 | Randazzo et al. ..................... 438/202 |

*Primary Examiner*—Carl Whitehead, Jr.
*Assistant Examiner*—Long Pham
*Attorney, Agent, or Firm*—Harness, Dickey & Pierce, P.L.C.

[57] ABSTRACT

A method for forming bipolar junction transistor with high gain via formulation of high voltage device in deep submicron process is disclosed. A substrate including a first part, a second part, and a third part is primarily provided; then, a first well in the first part and a second well in the second part are formed. A plurality of field oxide regions are formed on said substrate; subsequently, two third wells are formed in said third part. The following steps are to form a fourth well in said first well in said first part and two fifth wells in said second well in said second part; and to form a first gate on said first part between said two third wells, and a second gate on said second part between said two fifth wells. Next, a first spacer against said first gate and a second spacer against said second gate are formed. Further, first ions are introduced into said first part to serve as a collector region, and into said third part to serve as a first source/drain region. Finally, second ions are introduced into said first part to form an emitter region and a base region of a bipolar junction transistor, and into said second part to form a second source/drain region.

17 Claims, 16 Drawing Sheets

METHOD FOR FORMING BJT VIA FORMULATION OF HIGH VOLTAGE DEVICE IN ULSI

BACKGROUND OF THE INVENTION

1. Field of the Invention

The present invention generally relates to a method for forming a semiconductor device, and more particularly to a method for forming BJT (bipolar junction transistor) with high gain via formulation of high voltage device in ULSI (ultra large scale integration).

2. Description of the Prior Art

The bipolar junction transistor (BJT) is an electronic device with two pn junctions in very close proximity. In an one-dimensional bipolar junction transistors (BJT), there are three device regions: an emitter, a base, and a collector. Therein, the two pn junctions are referred to as a emitter-base (EB) and collector-base (CB) junctions. If the emitter and collector are doped n-type and the base is doped p-type, the device is called an npn transistor. If the opposite doping configuration is used, the device is referred to as a pnp transistor.

The BJTs are used as either amplifying or switching devices. In the first application, the transistor's function is to faithfully amplify small ac signals; in the second, a small current is used to switch the transistor from an ON to an OFF state and back.

On the development of deep submicron in ULSI, because the concentration of doping well is high and uniformity, the gain of vertical BJT is decreased. Moreover, the integrated process with forming high voltage device will be limited by the high concentration of well. Thereby, it is hard to integrate the high voltage devices into the deep submicron process.

For the foregoing reasons, there is a need to develop a method for forming bipolar junction transistor (BJT) with high gain to further integrate the high voltage devices into the deep submicron process.

SUMMARY OF THE INVENTION

In accordance with the present invention, a method for forming BJT with high gain is provided, that substantially increases the gain of BJT via integrated high voltage process.

It is another object of this invention to integrate high voltage devices into deep submicron process.

In one embodiment, A substrate including a first part, a second part, and a third part is primarily provided; then, a first well in the first part and a second well in the second part are formed. A plurality of field oxide regions are formed on said substrate; subsequently, two third wells are formed in said third part. The following steps are to form a fourth well in said first well in said first part and two fifth wells in said second well in said second part; and to form a first gate on said third part between said two third wells, and a second gate on said second part between said two fifth wells. Next, a first spacer against said first gate and a second spacer against said second gate are formed. Further, first ions are introduced into said first part to serve as a collector region, and into said third part to serve as a first source/drain region. Finally, second ions are introduced into said first part to form an emitter region and a base region of a bipolar junction transistor, and into said second part to form a second source/drain region.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The semiconductor devices of the present invention are applicable to a broad range of semiconductor devices and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also be advantageously employed in gallium arsenide, germanium, and other semiconductor materials. Accordingly, application of the present invention is not intended to be limited to those devices fabricated in silicon semiconductor materials, but will include those devices fabricated in one or more of the available semiconductor materials.

Moreover, while the present invention is illustrated by a number of preferred embodiments directed to silicon semiconductor devices, it is not intended that these illustrations be a limitation on the scope or applicability of the present invention. Further, while the illustrative examples use insulated gate control structures, it should be recognized that the insulated gate portions may be replaced with light activated or current activated structure(s). Thus, it is not intended that the semiconductor devices of the present invention be limited to the structures illustrated. These devices are included to demonstrate the utility and application of the present invention to presently preferred embodiments.

Further, various parts of the semiconductor elements have not been drawn to scale. Certain dimensions have been exaggerated in relation to other dimensions in order to provide a clearer illustration and understanding of the present invention. For the purposes of illustration the preferred embodiment of the semiconductor devices of the present invention have been shown to include specific P and N type regions, but it should be clearly understood that the teachings herein are equally applicable to semiconductor devices in which the conductivities of the various regions have been reversed, for example, to provide the dual of the illustrated device. Enhancement and depletion mode structures may be similarly interchanged.

Further, although the embodiments illustrated herein are shown in two dimensional views with various regions having width and depth, it should be clearly understood that these regions are illustrations of only a portion of a single cell of a device, which may include a plurality of such cells arranged in a three-dimensional structure. Accordingly, these regions will have three dimensions, including length, width and depth, when fabricated in an actual device.

Figure 1:
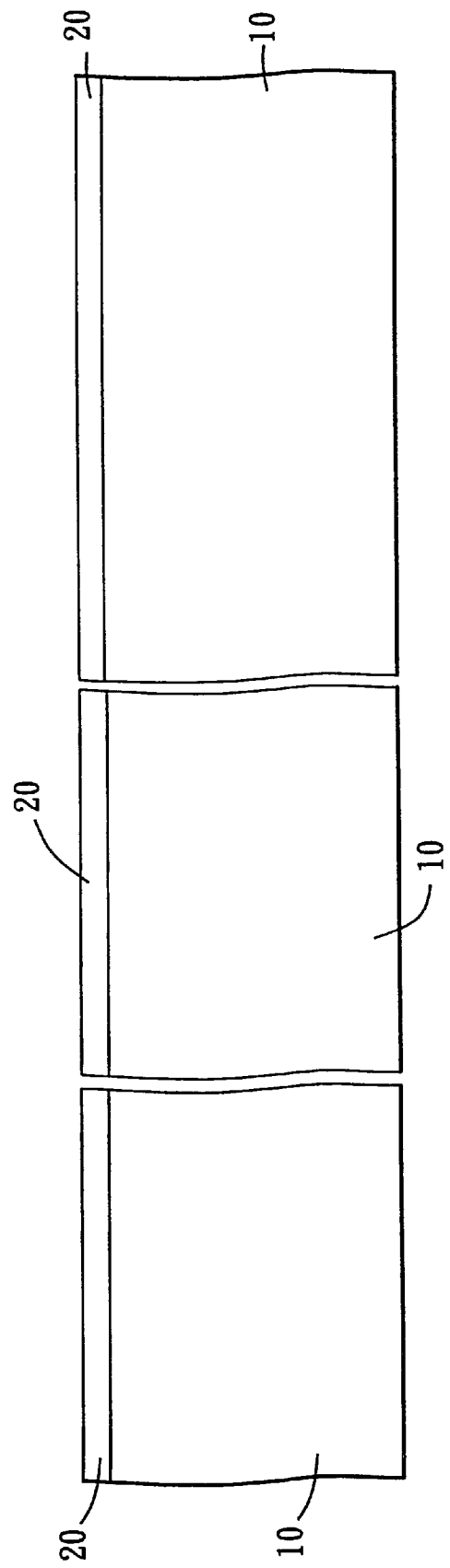
FIGS. 1–16 are schematic representations of structures at various stages during the formulation of BJT with high gain in accordance with a method disclosed.

The following is the detail of one embodiment in this invention, and suitable conditions are set forth below and will be explained by reference to FIGS. 1 to 16. Referring to FIG. 1, a substrate 10 is provided and an oxide layer 20 is formed thereon. In this embodiment, there are three semiconductor devices, i.e. high voltage n type MOS transistor, high voltage p type MOS transistor, and bipolar junction transistor, from left to right in each figure to illustrate the steps for forming BJT with high gain via high voltage process. The oxide layer 20 with thickness between about 100 to 300 angstroms is formed by any conventional method such as heated in furnace. This oxide layer 20 is a sacrificial oxide layer whose intent will prevent channel effect on the following ion implantation.

Figure 2:
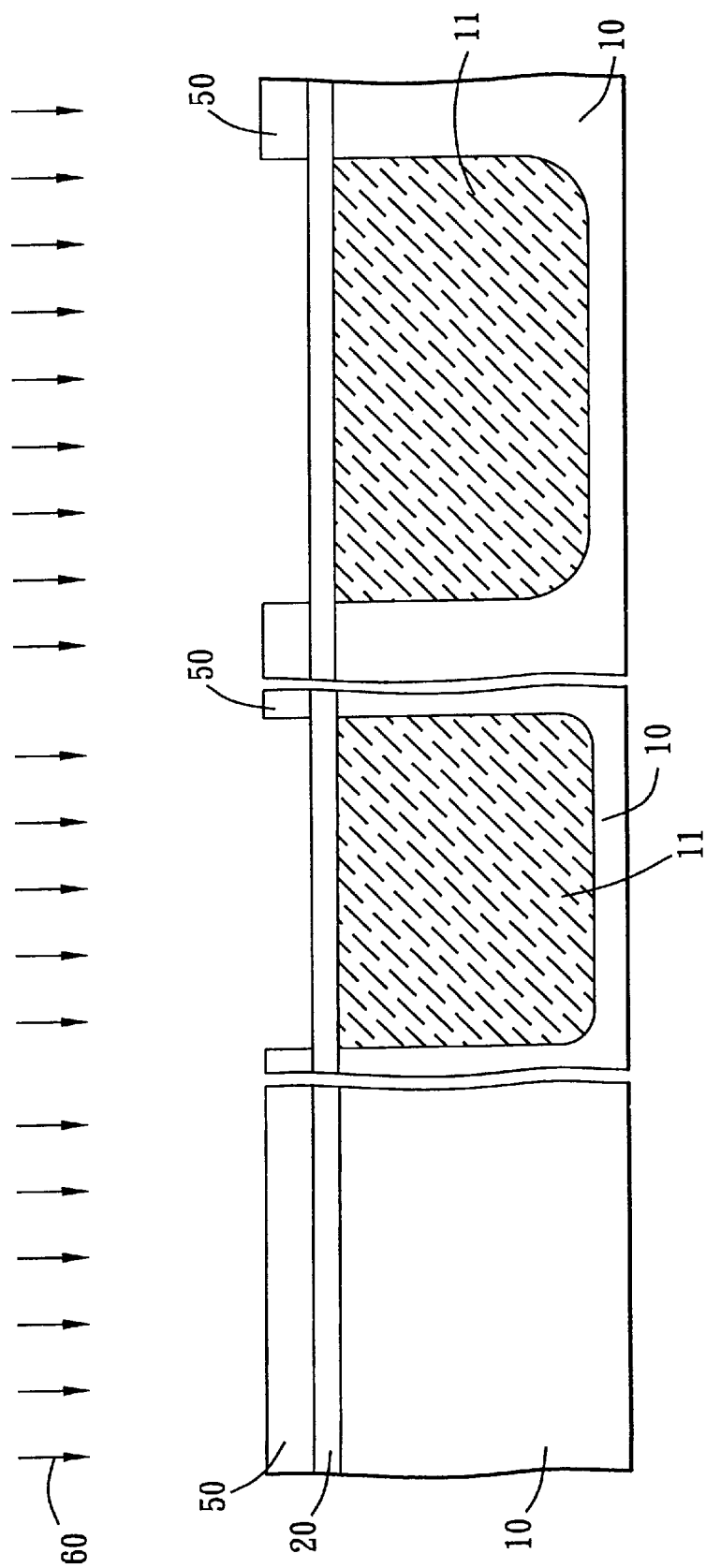
Figure 3:
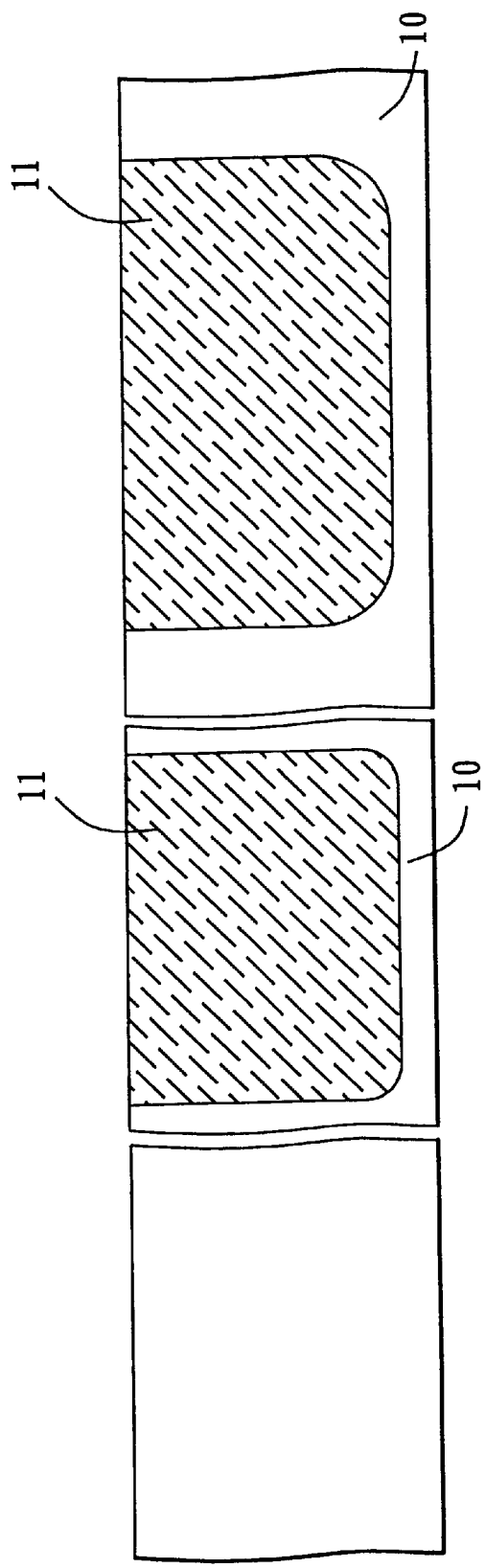

Referring to FIG. 2, a photoresist layer 50 is formed on this oxide layer 20 by any suitable method and a high-voltage n-well pattern is then transfered to this photoresist layer 50. The transferred pattern is only on the p type MOS transistor and bipolar junction transistor for these devices requiring the n type substrate. Hence, no pattern is transferred to the photoresist layer 50 on the n type MOS transistor. Then, an ion implantation 60 is introduced into the substrate 10 with energy between about 3e15 to 1e16/cm3 to form a high-voltage n-well 11 and the photoresist layer 50 is then stripped. The term high-voltage denotes the voltages which the devices formed in these wells will be subjected to; high voltages, such as twelve and eighteen volts, or transients up to about sixty volts, usually require larger and deeper tanks but with lower dopant concentrations. Having finished the ion implantation step, the wafer is placed into furnace and the ions will drive in substrate 10 by high temperature diffusion. After the oxide layer 20 is removed by any conventional method, the structure is shown in FIG. 3.

Figure 4:
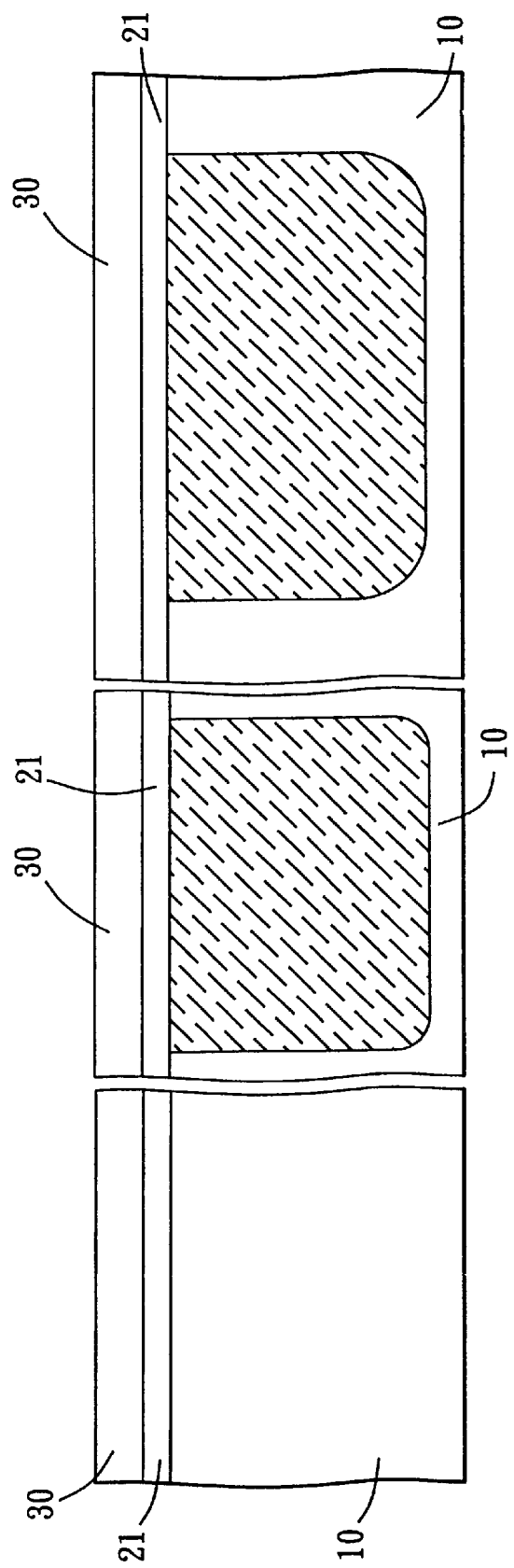

Referring to FIG. 4, a pad oxide layer 21 is formed on the substrate 10 by conventional thermal method and has a thickness between about 100 to 300 angstroms. The purpose of the pad oxide layer 21 is to serve as a buffer between substrate 10 and following silicon nitride layer, since shear stress is produced between silicon crystal and silicon nitride layer and defects will be generated. Then, a silicon nitride layer 30 is deposited on the pad oxide layer 21 by any conventional method, such as low pressure chemical vapor deposition (LPCVD) method or plasma enhanced chemical vapor deposition (PECVD) method, and has a thickness between about 1000 to 3000 angstroms.

Figure 5:
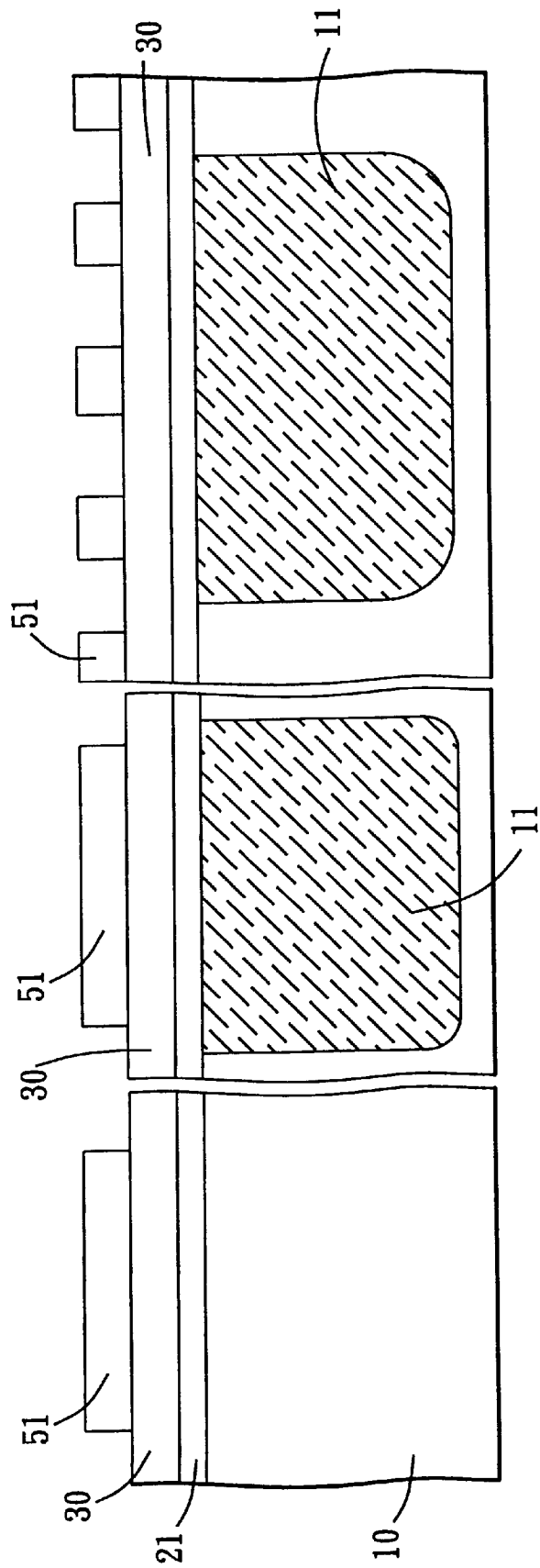
Figure 6:
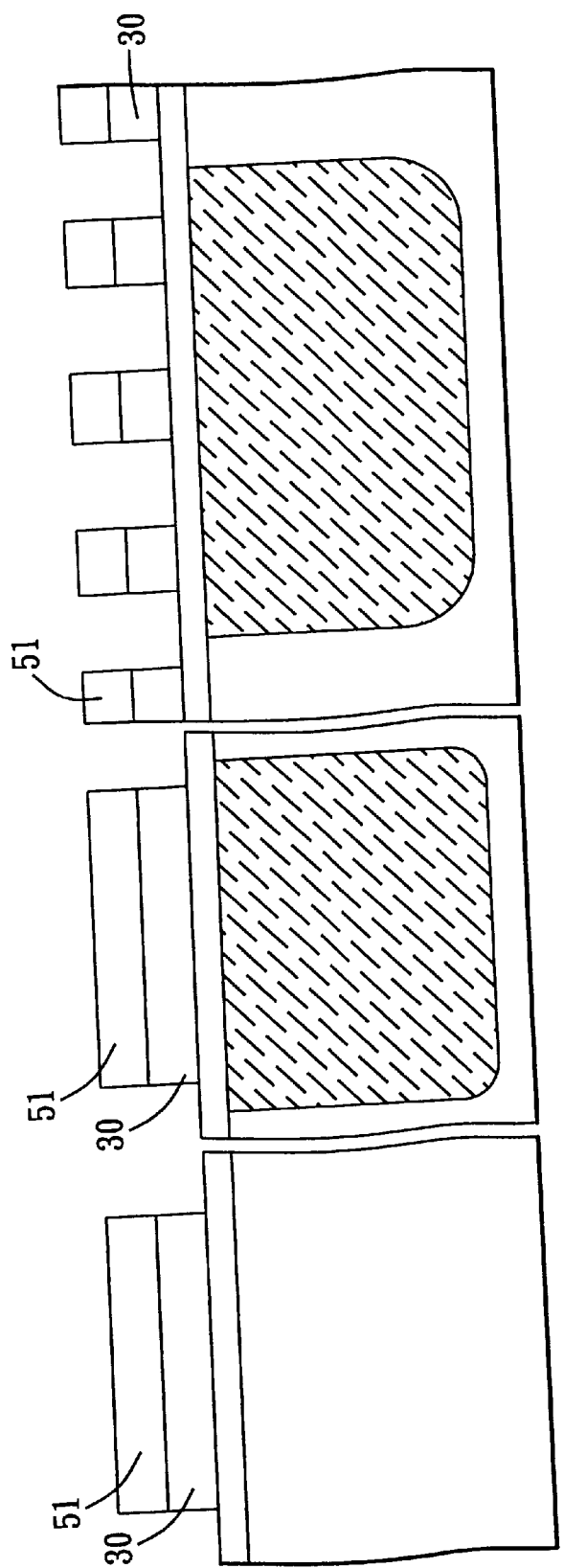

Referring to FIG. 5, a photoresist layer 51 is formed on the silicon nitride layer 30 and transferred a diffusion mask pattern into the photoresist layer 51. Then, the silicon nitride layer 30 is etched by utilizing photoresist layer 51 as a mask, and the result is shown in FIG. 6.

Figure 7:
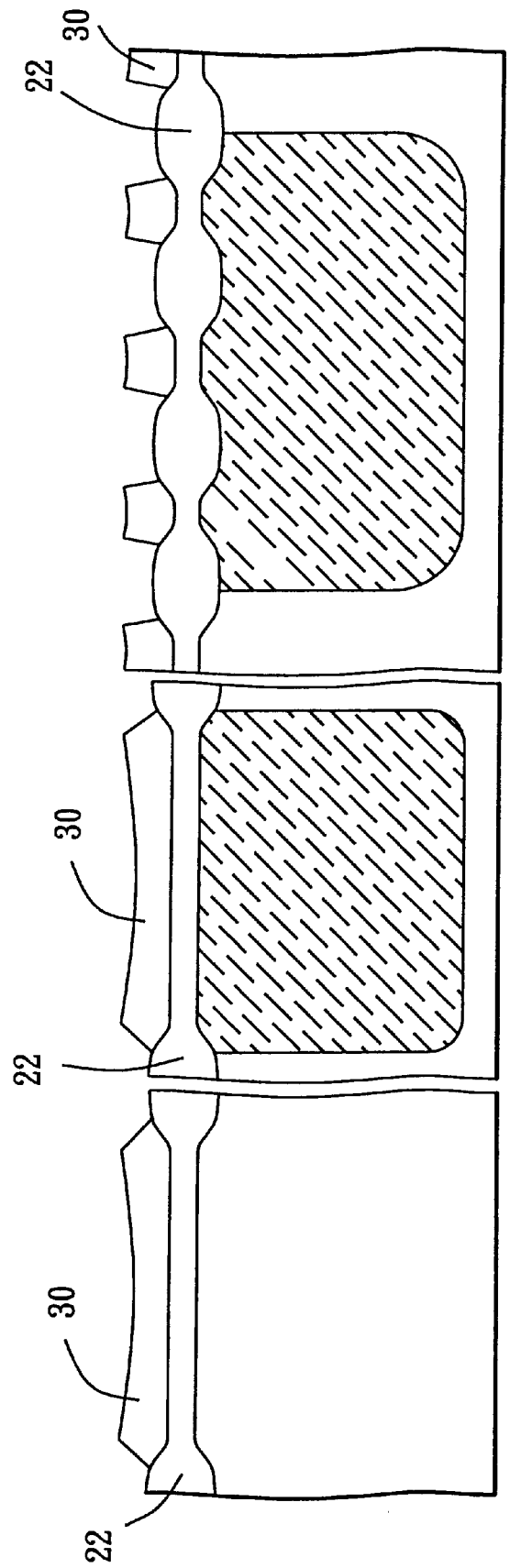
Figure 8:
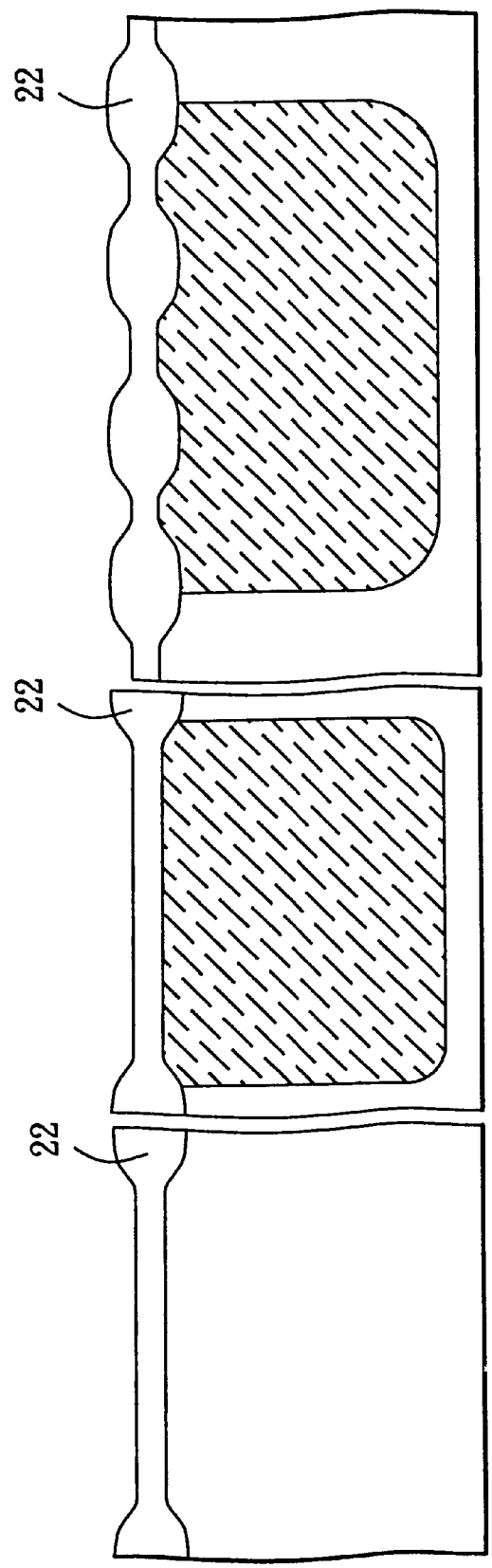

The photoresist layer 51 is then stripped and the wafer is placed into furnace at temperature between about 800 to 1100 again to form field oxidation region 22 as shown in FIG. 7. This silicon nitride layer 30 is then removed by any conventional method, referring to FIG. 8.

Figure 9:
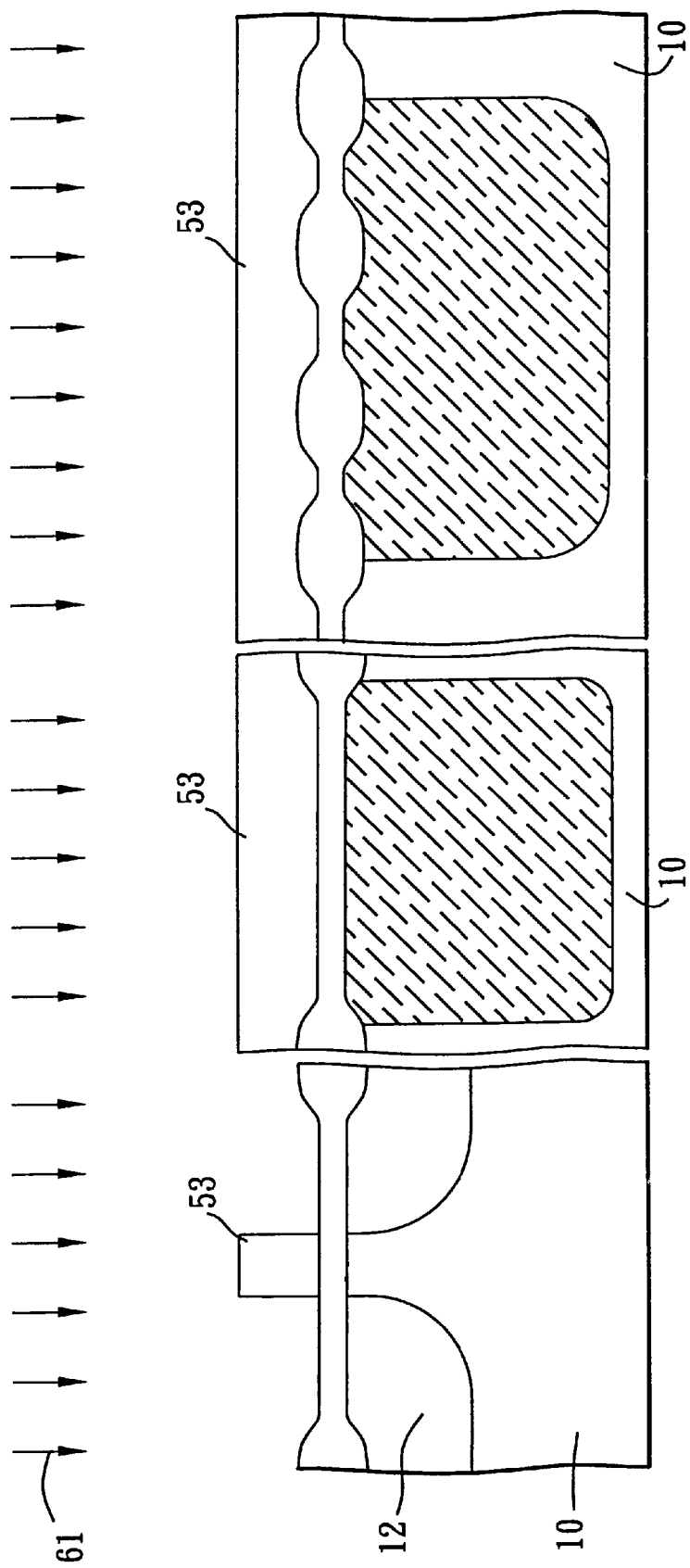
Figure 10:
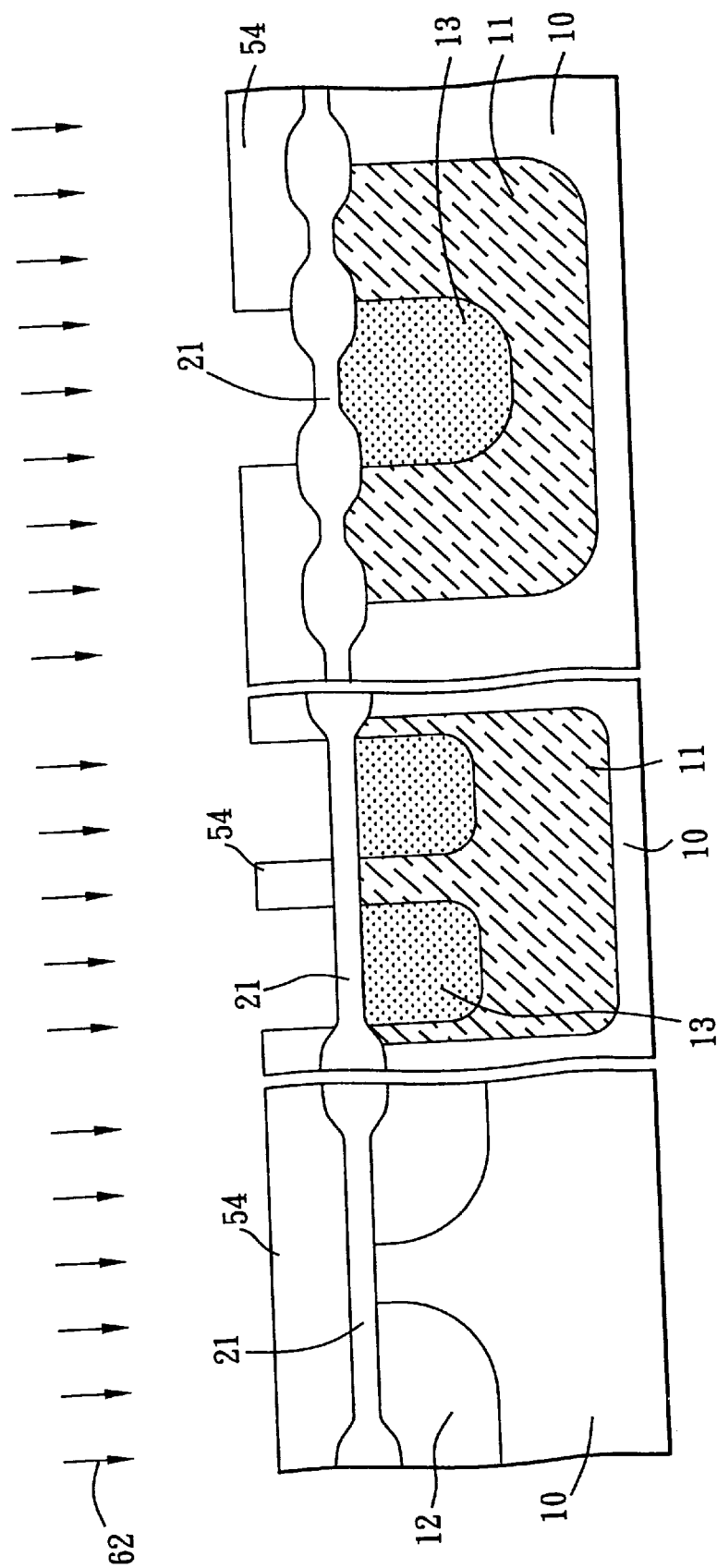
Figure 11:
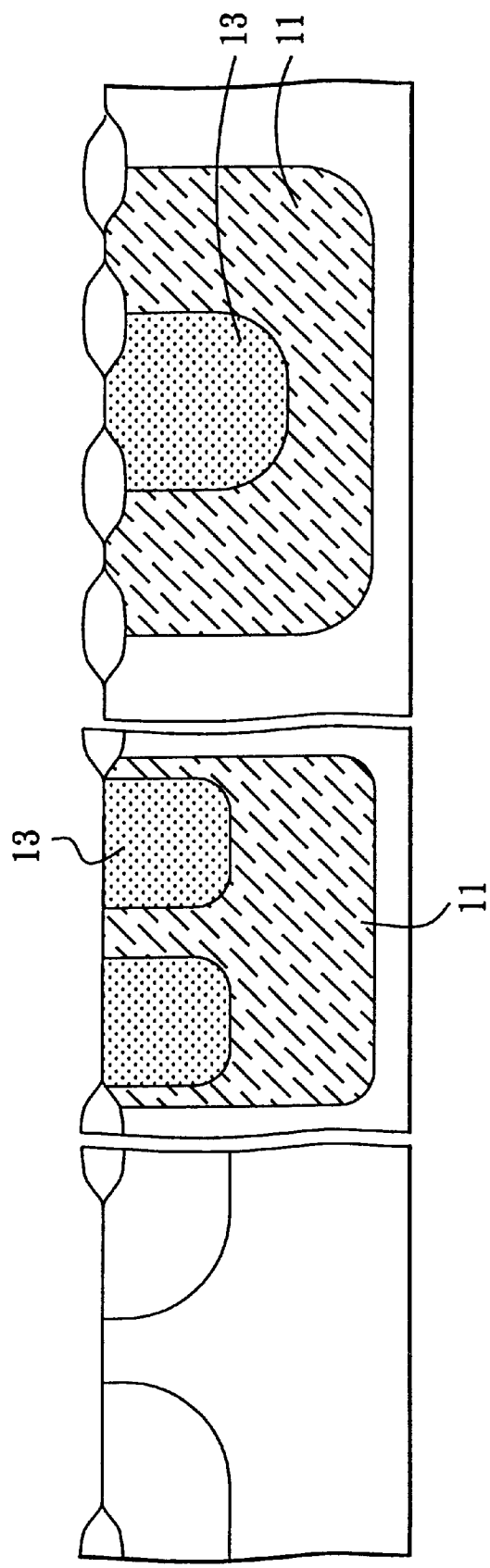

Referring to FIG. 9, another photoresist layer 53 is formed over the substrate 10 by any suitable method, further, another n-well pattern is transferred to the photoresist layer 53 on high voltage n type MOS transistor. Then, an ion implantation 61 is introduced into substrate 10 to form a low-voltage n-well 12 in high voltage n type MOS transistor, and then the photoresist layer 53 is stripped. Similarly, referring to FIG. 10, another photoresist layer 54 is formed on this substrate 10 by any suitable method and a low-voltage p-well pattern is transferred to in this photoresist layer 54 on the high voltage p type MOS transistor and bipolar junction transistor. Next, an ion implantation 62 is introduced into substrate 10 to form a low-voltage p-well 13 and the photoresist layer 54 is then stripped. Having finished the two ion implantation steps, the wafer is placed into furnace again and annealing by high temperature diffusion. Then, the oxide layer 21 is removed by any conventional method, as shown in FIG. 11.

Figure 12:
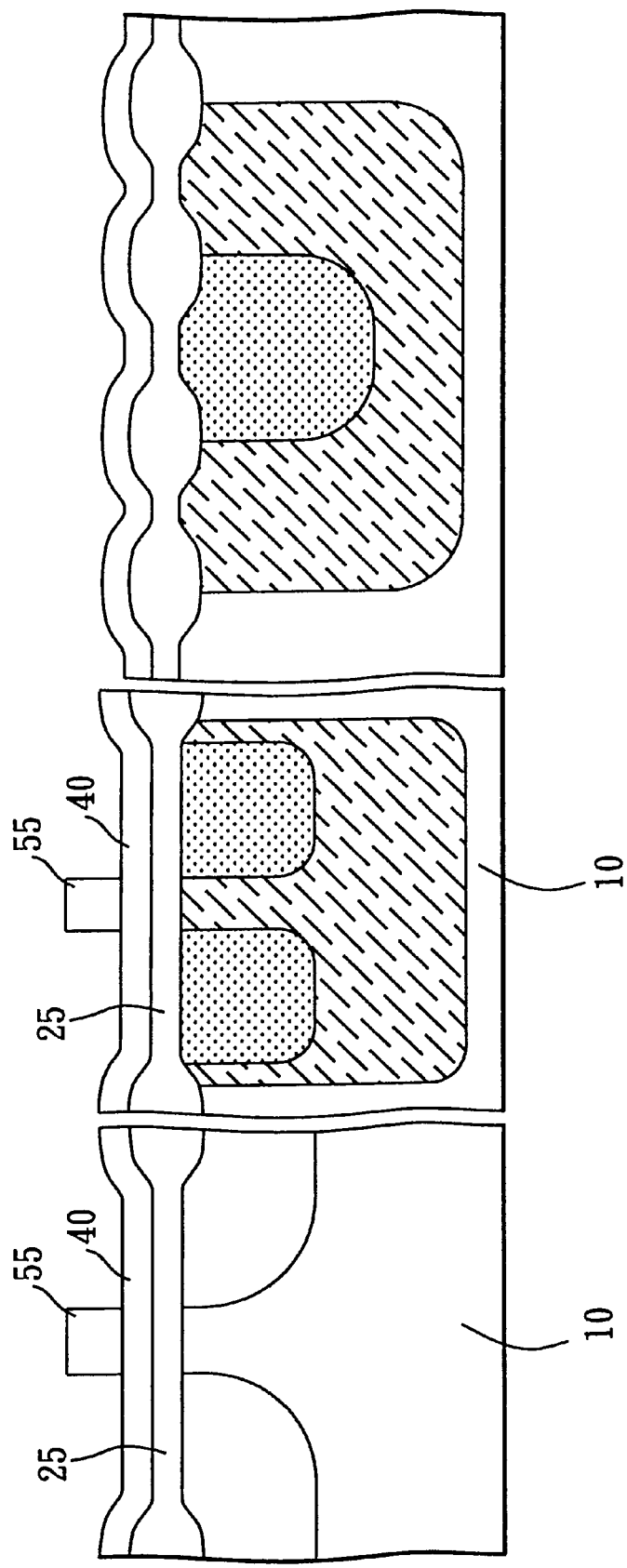

The following steps are forming gate, source and drain in MOS transistor and collector, emitter, and base in bipolar junction transistor. Referring to FIG. 12, a gate oxide layer 25 is formed on the substrate 10 by any conventional method. A polysilicon layer 40 is deposited and doped on the oxide layer 25 by any conventional method. In the preferred embodiment, the gate conductor comprises doped polysilicon. Other conductive materials including metals or suicides can also be used. Then, a photoresist layer 55 is formed on the polysilicon layer 40 and transferred a gate pattern to this photoresist layer 55 of the both MOS transistors. Gate pattern keeps at a distance from source region and drain region respectively to lower the lateral electric field and increase voltage. The distance mentioned above is referred to as offset region.

Figure 13:
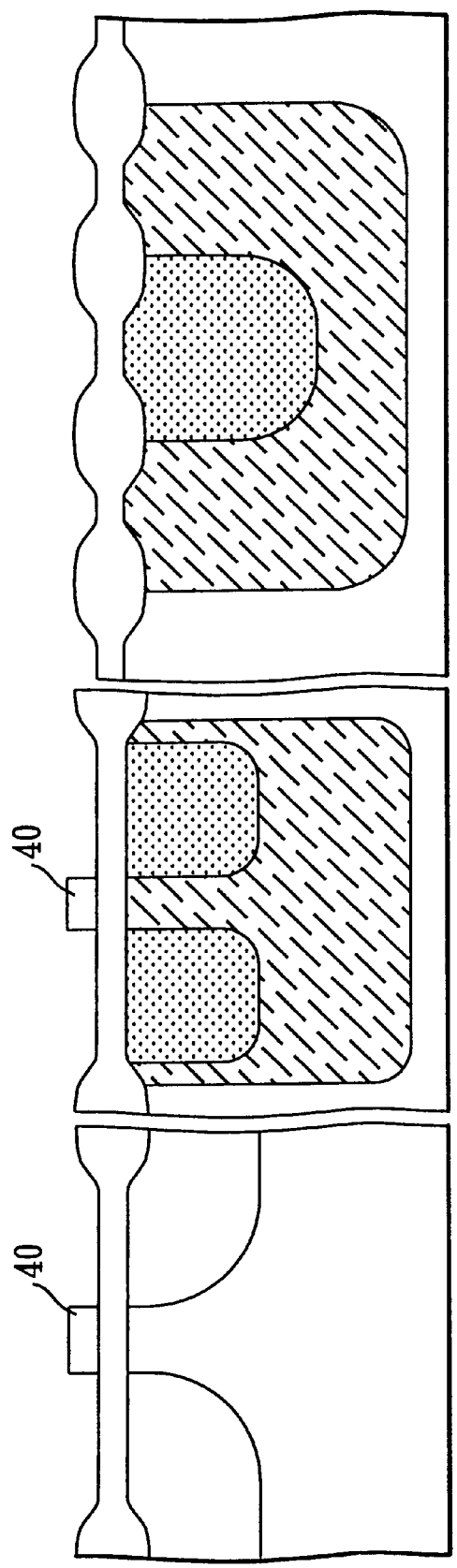
Figure 14:
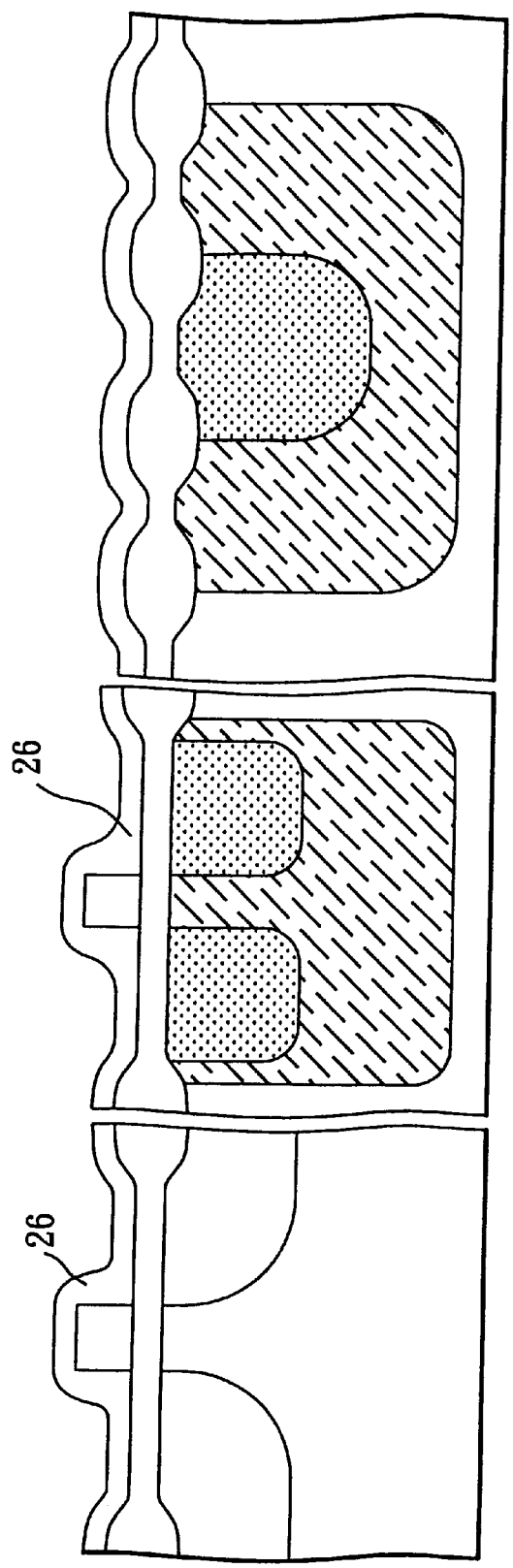
Figure 15:
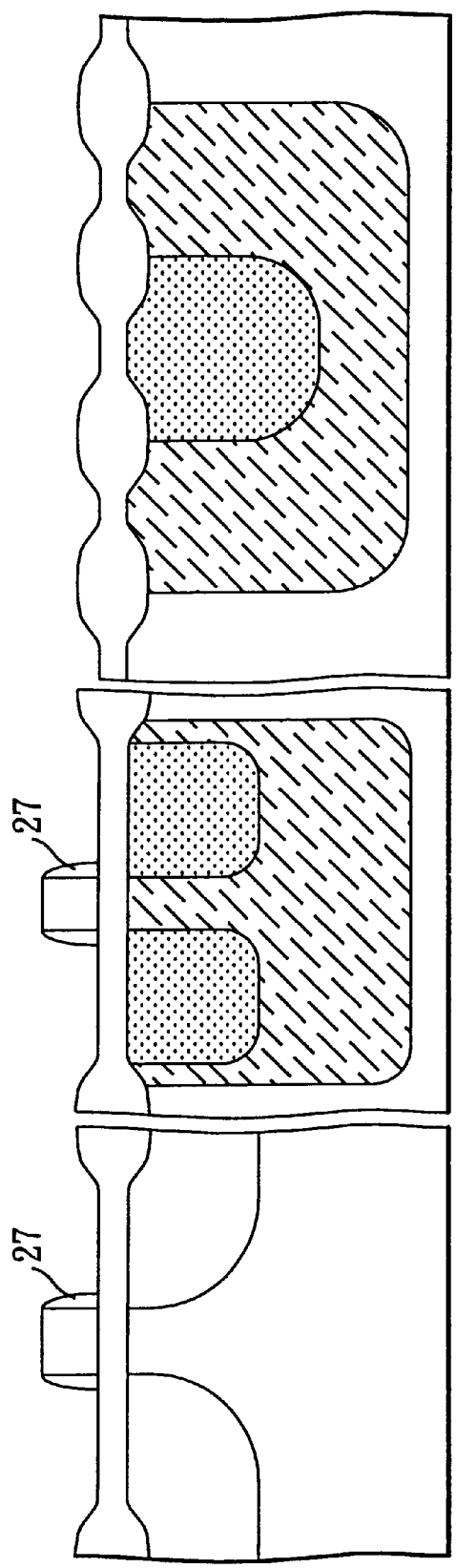
Figure 16:
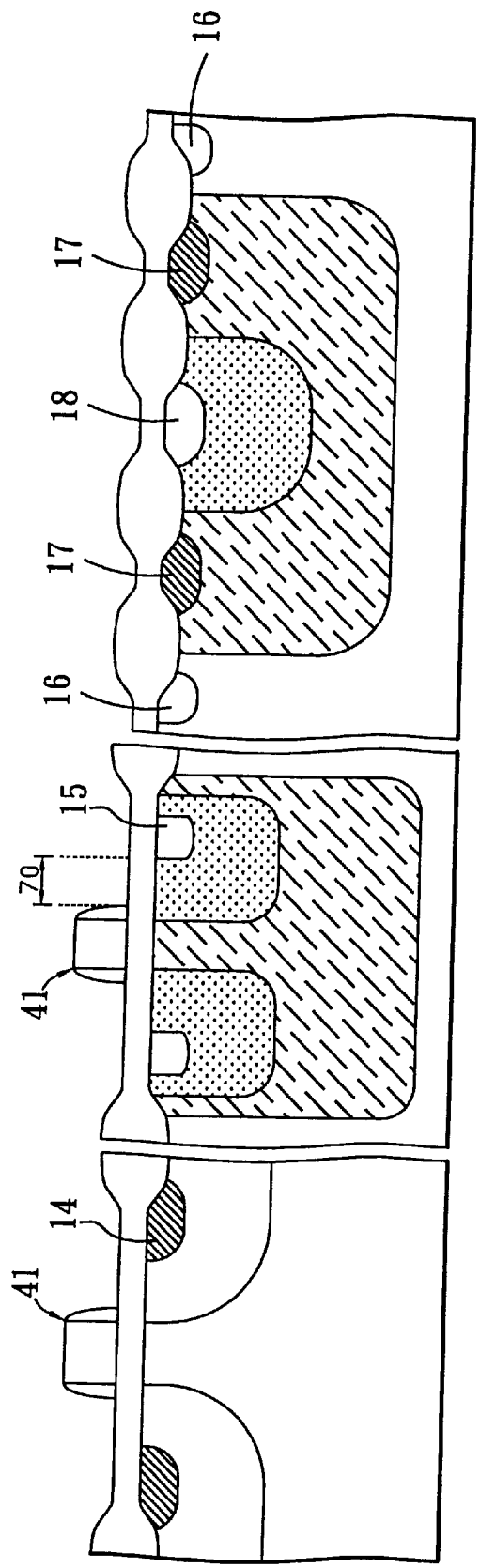

Then referring to FIG. 13, the polysilicon layer 40 is etched by conventional etch process. Next, referring to FIG. 14, a conformal oxide layer 26 is deposited on all surfaces and then etched back by any conventional anisotropic dry etching to form spacer 27, as shown in FIG. 15. Then, referring to FIG. 16, source/drain regions 14 of high voltage n type MOS transistor and source/drain regions 15 of high voltage p type MOS transistor are formed on the opposite ends of the gate structures 41 and leave the offset region 70 from gate 41 to source/drain 14 and 15. The emitter 16, collector 17, and base 18 of the bipolar junction transistor are formed while forming source/drain region of the MOS transistor. Therein, the emitter 16 and base 18 are formed with high voltage p type MOS transistor and the collectors 17 are formed with high voltage n type MOS transistor.

Although specific embodiments have been illustrated and described, it will be obvious to those skilled in the art that various modifications may be made without departing from what is intended to be limited solely by the appended claims.

What is claimed is:

1. A method for forming semiconductor device, comprising:

providing a substrate including a first part, a second part, and a third part;

forming a first well in the first part and a second well in the second part;

forming a plurality of field oxide regions on said substrate;

forming two third wells in said third part;

forming a fourth well in said first well in said first part and two fifth wells in said second well in said second part;

forming a first gate on said third part between said two third wells and a second gate on said second part between said two fifth wells;

forming a first spacer against said first gate and a second spacer against said second gate;

introducing first ions into said first part to form a collector region of a bipolar junction transistor, and into said third part to form a first source/drain region, wherein said first source/drain region keeps a distance from said first gate; and introducing second ions into said first part to form a base region and an emitter of said bipolar junction transistor, and into said second part to form a second source/drain region, wherein said second source/drain region keeps a distance from said second gate.

2. The method according to claim 1, wherein said substrate comprises p type substrate.

3. The method according to claim 1, wherein said first well comprises n-well.

4. The method according to claim 1, wherein said second well comprises n-well.

5. The method according to claim 1, wherein said field oxide regions are formed by thermal oxidation process.

6. The method according to claim 1, wherein said third wells comprise n-wells.

7. The method according to claim 1, wherein said fourth well comprises p-well.

8. The method according to claim 1, wherein said fifth wells comprise p-wells.

9. The method according to claim 1, wherein said first ions comprise n type ions.

10. The method according to claim 1, wherein said second ions comprise p type ions.

11. The method according to claim 1, wherein said first part is a bipolar junction transistor region.

12. The method according to claim 1, wherein said second part is a high voltage p type metal-oxide-semiconductor transistor region.

13. The method according to claim 1, wherein said third part is a high voltage n type metal-oxide-semiconductor transistor region.

14. The method according to claim 1, wherein said first ions are introduced by ion implantation process.

15. The method according to claim 1, wherein said first ions are introduced by diffusion process.

16. The method according to claim 1, wherein said second ions are introduced by ion implantation process.

17. The method according to claim 1, wherein said second ions are introduced by diffusion process.

* * * * *